(12) United States Patent
Peterson et al.

(10) Patent No.: US 8,749,986 B1
(45) Date of Patent: Jun. 10, 2014

(54) FLEXIBLE MIDPLANE AND ARCHITECTURE FOR A MULTI-PROCESSOR COMPUTER SYSTEM

(75) Inventors: Eric C. Peterson, McKinney, TX (US); Christian L. Belady, McKinney, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 1691 days.

(21) Appl. No.: 11/314,479

(22) Filed: Dec. 21, 2005

Related U.S. Application Data

(63) Continuation of application No. 11/283,942, filed on Nov. 21, 2005, now abandoned.

(51) Int. Cl.
*H05K 1/00* (2006.01)

(52) U.S. Cl.
USPC ........... 361/749; 174/254; 174/525; 174/532; 439/638

(58) Field of Classification Search
USPC ......... 361/749, 638, 640, 690, 728, 733, 748, 361/755, 790, 792, 803, 807, 649, 651, 736, 361/766; 174/254, 525, 532, 57, 59
See application file for complete search history.

(56) References Cited

U.S. PATENT DOCUMENTS

| | | | | |
|---|---|---|---|---|
| 6,061,245 | A * | 5/2000 | Ingraham et al. | 361/749 |
| 6,191,945 | B1 * | 2/2001 | Belady et al. | 361/704 |
| 6,462,957 | B1 * | 10/2002 | Kwong et al. | 361/796 |
| 7,068,500 | B1 * | 6/2006 | Beinor, Jr. et al. | 361/685 |
| 2003/0095388 | A1 * | 5/2003 | Jiao et al. | 361/749 |
| 2005/0207134 | A1 * | 9/2005 | Belady et al. | 361/796 |
| 2005/0276024 | A1 * | 12/2005 | Westbury | 361/749 |
| 2006/0110096 | A1 * | 5/2006 | Terada et al. | 385/14 |
| 2006/0250780 | A1 * | 11/2006 | Goodwin | 361/767 |

* cited by examiner

*Primary Examiner* — Hoa C Nguyen

(57) ABSTRACT

A flexible midplane comprises: a printed circuit board including: a middle section and at least one side section; and a flexible region disposed between the middle section and each side section; wherein each flexible region permits the corresponding side section to be bent in relation to the middle section.

20 Claims, 14 Drawing Sheets

FLEXIBLE MIDPLANE AND ARCHITECTURE FOR A MULTI-PROCESSOR COMPUTER SYSTEM

CO-PENDING U.S. PATENT APPLICATIONS

This application is a continuation of the U.S. patent application Ser. No. 11/283,942, filed Nov. 21, 2005 now abandoned, and entitled "Flexible Midplane and Architecture For A Multi-Processor Computer System", which application being assigned to the same assignee as the instant application.

BACKGROUND

Multi-processor computer systems, like computer servers, for example, are comprised of a multiplicity of cell boards which are the major building blocks thereof. Typically, the cell boards are interconnected for system communication through a backplane which is located in a plane across the back of a card cage or cabinet containing the cell boards. Generally, the backplane is a rigid, two dimensional, large circuit card containing mating connectors and printed circuit runs interconnecting the pins of the connectors. One or more connectors of each cell board is or are mated orthogonally to corresponding connectors of the backplane. In this arrangement, the cell boards may be inserted into or extracted from their corresponding connectors in the backplane through the front of the cage or cabinet.

In operation, the multi-processor computer systems generate a large amount of heat from the high density integrated circuits of the cell boards thereof. Generally, a plurality of fans is disposed within the cabinet to provide cooling air flow to maintain a safe operating temperature for the system. Because of the present backplane arrangement which is impervious to airflow, cooling air can not effectively flow front to back or vice versa, and, thus, must flow up or down through the cabinet. In addition, the present backplane arrangement allows only a small cross-sectional up/down air flow area through the cabinet which increases the impedance to airflow and causes the airflow driving equipment to work harder. Moreover, because the backplanes are two dimensional, they limit the circuit routing area available to the system designer.

The present invention alleviates these drawbacks and provides effective cooling air flow front-to-back or back-to-front through the system cabinet while maintaining convenient access to the various circuit boards of the system without disassembly thereof.

SUMMARY

In accordance with one aspect of the present invention, a flexible midplane comprises: a printed circuit board including: a middle section and at least one side section; and a flexible region disposed between the middle section and each side section; wherein each flexible region permits the corresponding side section to be bent in relation to the middle section.

DETAILED DESCRIPTION OF THE INVENTION

Figure 1A:
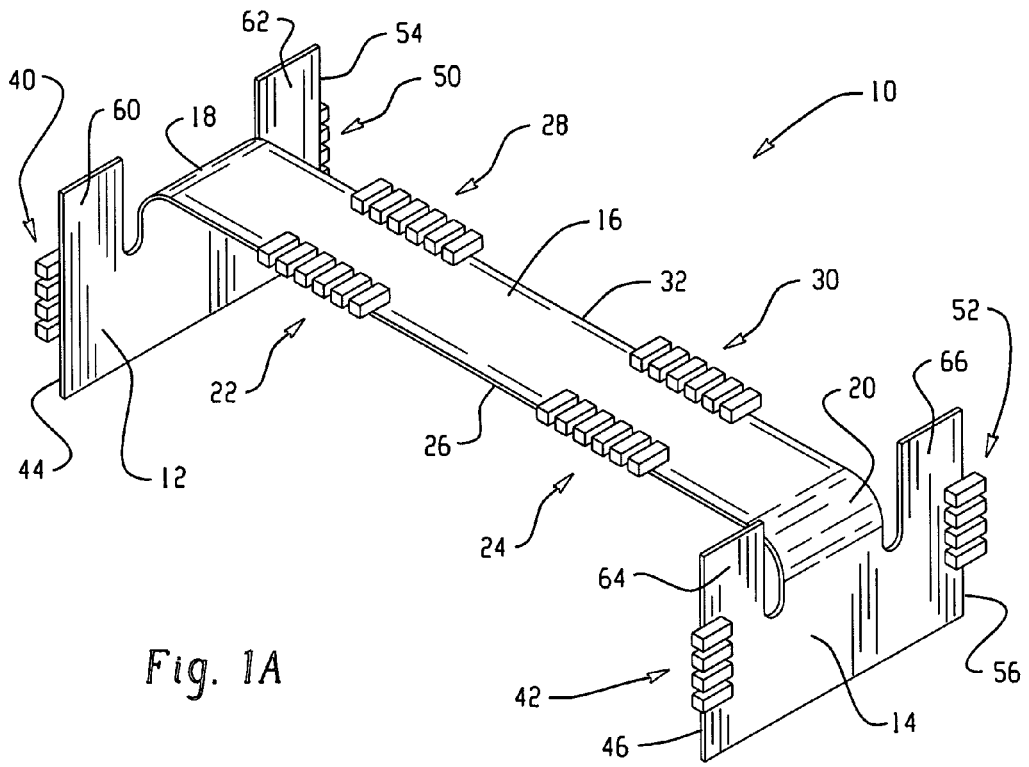
FIGS. 1A and 1B are respective top and bottom isometric perspective views of an exemplary flexible midplane suitable for embodying one aspect of the present invention.
Figure 1B:
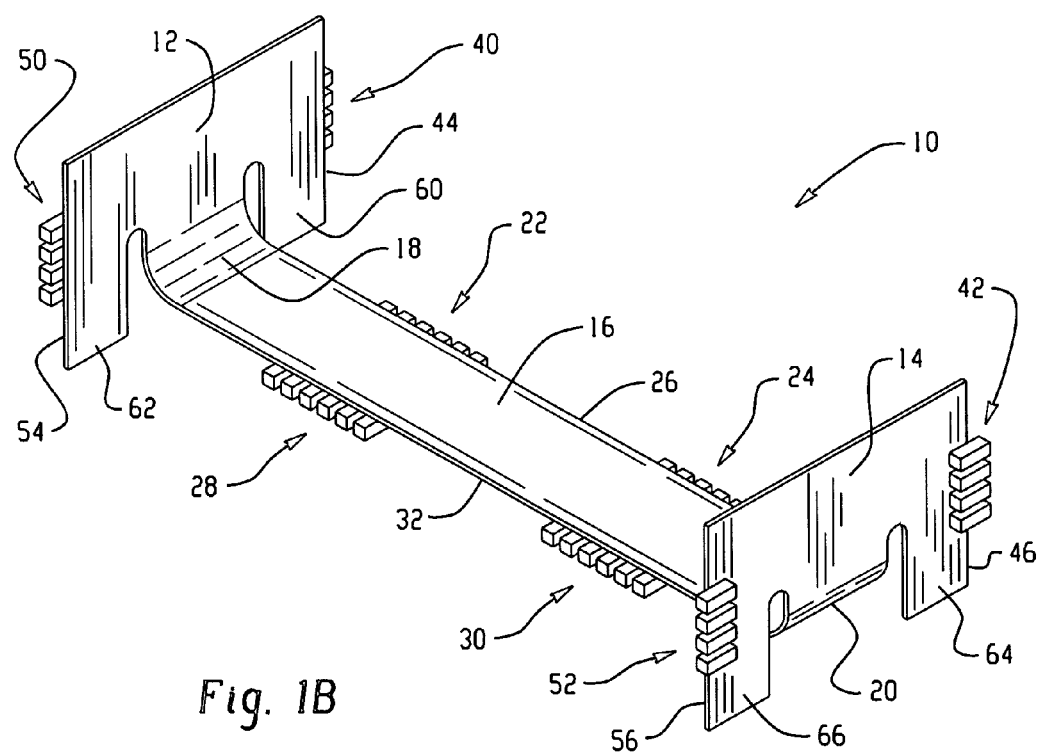

In the various embodiments of a multi-processor computer system described below, the traditional backplane interconnect assembly is replaced with two or more flexible midplanes for interconnecting the cell boards of the system in planes which are conducive to effective front-to-back and back-to-front cooling air flow patterns. FIGS. 1A and 1B illustrate top and bottom isometric perspective views, respectively, of an exemplary flexible midplane 10 suitable for embodying this aspect of the present invention. Referring to FIGS. 1A and 1B, the exemplary midplane 10 comprises side sections 12 and 14 which may be bent or flexed in a plane substantially orthogonal to the plane of a middle section 16. The side and middle sections 12, 14 and 16 of the midplane 10 may be comprised of one or more rigid layers of a FR4 based material, for example, which is a material generally used in the manufacture of printed circuit (PC) boards. Other suitable PC board materials may work just as well. Between the side section 12 and middle section 16 may be a flexible region 18 and between the side section 14 and middle section 16 may be another flexible region 20. The flexible regions 18 and 20 may be comprised of a flexible material, like Kapton™ (which is a trademark of Dupont), for example, which permits the side sections 12 and 14 to be bent in relation to the middle section 16.

While FIGS. 1A and 1B illustrates the flexible midplane 10 as having two sides 12 and 14, it is understood that the midplane 10 may have only one side 12 or 14 without deviating from the broad principles of the present invention. In the embodiment in which the midplane 10 has only one side 12 or 14, the section 16 would be cantilevered from the single side 12 or 14.

The midplane 10 may be manufactured as a single PC board of multiple thin layers of the rigid material. To provide for a desired degree of flexibility in the regions 18 and/or 20, some or all of the thin layers of the rigid material may be replaced with layers of a flexible material. For example, in the regions 18 and/or 20, layers of the flexible material may be intermixed with layers of the rigid material to establish the degree of flexibility desired for a particular application. In some applications, it may be desired to maintain the shape of the midplane 10 after bending one or both of the sections 12 and 14 in relation to the middle section 16. In other applications, the regions 18 and/or 20 are desired to be spring-like and the shape of the midplane 10 after bending may be held in place by proper mounting apparatus, for example.

In some applications, the regions 18 and/or 20 may have to be flexed or bent into a desired shape by a treatment, like using presses and/or with the application of heat to the region, perhaps during the manufacture of the PC board 10, for example. In this embodiment, the rigid material of region 18 and/or region 20 may not be replaced with layers of a flexible material and the resulting midplane 10 would retain its shape after such treatment.

Connectors 22 and 24 may be disposed along one edge 26 of middle section 16 for mating to connectors of a pair of cell boards which will become more evident from the description below. In addition, connectors 28 and 30 may be disposed along the opposite edge 32 of middle section 16 for mating to connectors of another pair of cell boards. Thus, a plurality of cell boards may be interconnected to the front and back of each exemplary midplane 10 to form a computer system assembly in which the cell boards of each midplane 10 are disposed substantially in the same plane as the middle section 16 of the midplane 10 which will be better understood from the more detailed description to follow.

In addition, connectors 40 and 42 may be disposed along one edge 44 and 46 of the side sections 12 and 14, respectively. Likewise, connectors 50 and 52 may be disposed along the opposite edges 54 and 56 of the side sections 12 and 14, respectively. The connectors 40 and 42 may be used for communicative interconnection between two or more midplane boards 10 along one of the edges thereof and connectors 50 and 52 may be used for similar interconnection along the opposite edges. The interconnection between midplane boards 10 will be explained in greater detail herein below.

Also, in the present embodiment, section 12 may be patterned to form legs or feet 60 and 62 along respective edges 44 and 54 thereof. Likewise, section 14 may be patterned to form legs or feet 64 and 66 along respective edges 46 and 56 thereof. The legs 60-66 of the side sections 12 and 14 offer additional side edge area for mounting the connectors 40, 42, 50 and 52 and may be used to support the midplane 10 after being shaped and/or to assist in the cabinet mounting thereof, for example.

Figure 3A:
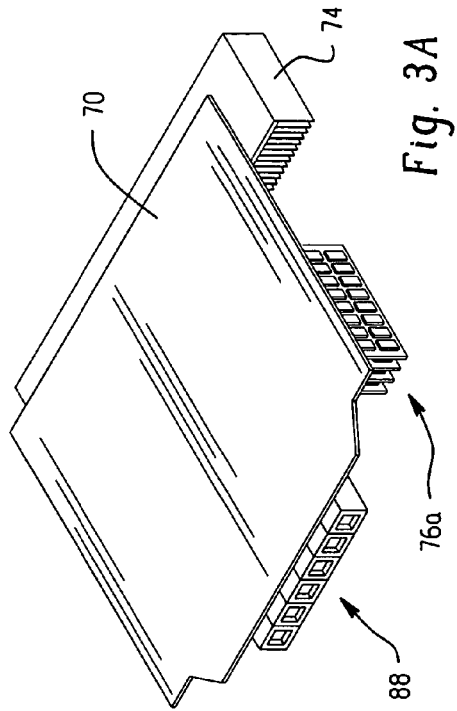
FIGS. 3A and 3B are respective front and back isometric perspective views of the bottom of the exemplary cell board.
Figure 2A:
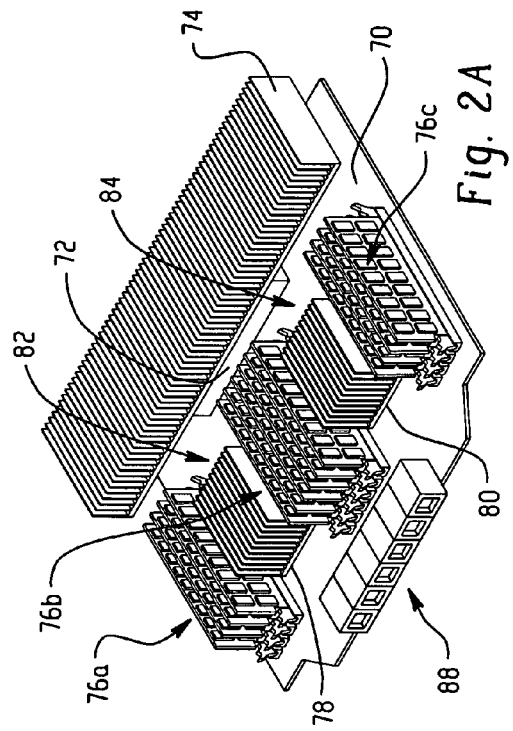
FIGS. 2A and 2B are respective front and back isometric perspective views of the top of an exemplary cell board for use in a flexible midplane assembly.
Figure 3B:
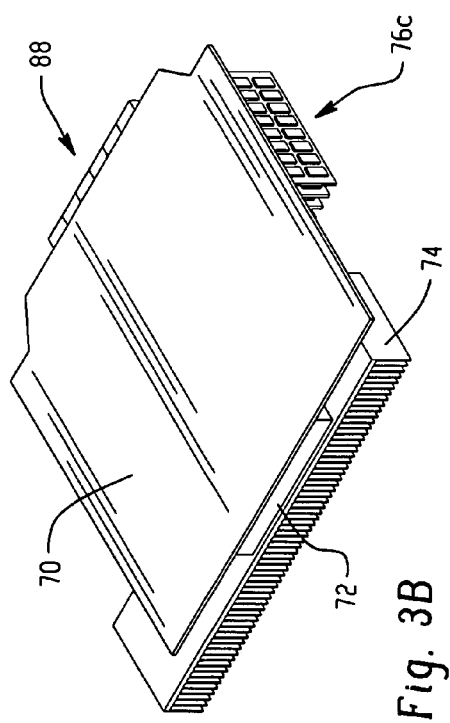
Figure 2B:
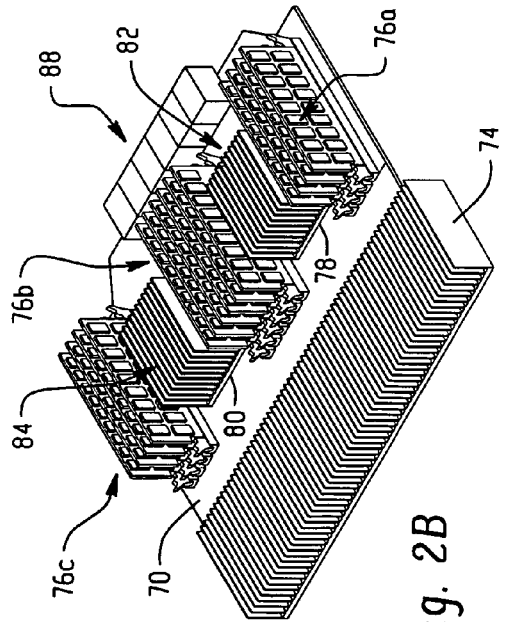

FIGS. 2A and 2B are respective front and back isometric perspective views of the top of an exemplary cell board for use in a flexible midplane assembly structure. FIGS. 3A and 3B are respective front and back isometric perspective views of the bottom of the exemplary cell board. Referring to FIGS. 2A, 2B, 3A and 3B, the exemplary cell board comprises a printed circuit (PC) board 70 on which an assortment of processor, memory and controller integrated circuits (ICs) are assembled and interconnected together through etched circuit runs on and within the PC board 70.

More specifically, a processor IC 72 may be disposed on the board 70, preferably in a back portion thereof. While only one processor 72 is illustrated in the present example, it is understood that more than one processor may be disposed on board 70 in other configurations. On top of the processor IC 72 is disposed a finned heat sink 74 for protecting the IC 72 from damage due to overheating during operation thereof. Memory ICs are disposed on board 70 in the form of rows of dual in-line memory modules (DIMMs) along areas 76a, 76b and 76c. Each DIMM of board 70 is connected through a corresponding DIMM connector to the circuit runs of board 70. Also disposed on board 70 may be two controller ICs 78 and 80, which may be ASICs, for example, for managing communication between components on the cell board 70. The controller ICs 78 and 80 may include respective heat sinks 82 and 84 disposed thereon for heat damage protection during operation thereof.

Cell board 70 may further include a set of connectors 88 for mating with one of the sets of connectors 22, 24, 28 or 30 of the midplane 10 (see FIGS. 1A and 1B) as will become more evident from the description found herein below. In the present example, the connectors 88 may be of the well-known orthogonal connector type, such as the "X-Vector HS High Speed Midplane for Cross-Connection" connector available from Japan Aviation Electronics Industry, Limited ("JAE"), for example. The cell board 70 may include other connectors (not shown) for interfacing to input/output (IO) devices, for example.

In the exemplary cell board embodiment of FIGS. 2A, 2B, 3A and 3B, the components are arranged on board 70 to permit effective front-to-back and back-to-front cooling air flow across the board surface thereof. That is, each component is arranged to maximize surface area and provide the least amount of resistance to such air flow. For example, the finned heat sinks 74, 82 and 84 are arranged so that front-to-back cooling air flows in a path through the channels formed between the fins thereof. In addition, the DIMMs are arranged in rows so that the front-to-back cooling air flows in a path between the rows of DIMMS and across the front and back surface areas thereof.

Figure 5A:
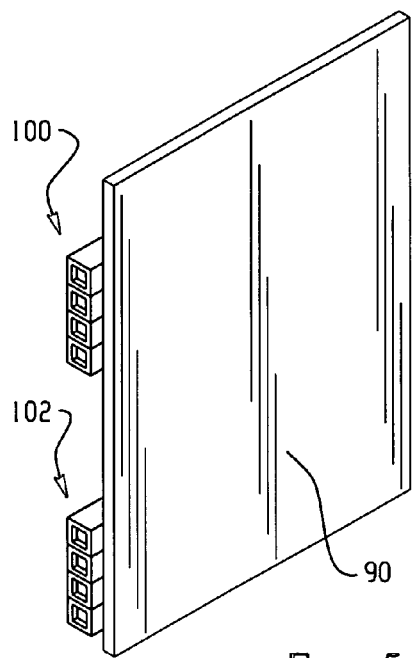
FIGS. 5A and 5B are respective front and back isometric perspective views of the bottom of the exemplary interconnect board.
Figure 5B:
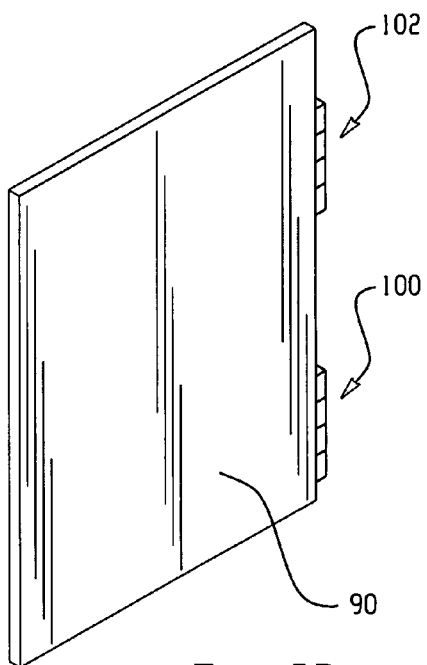
Figure 4A:
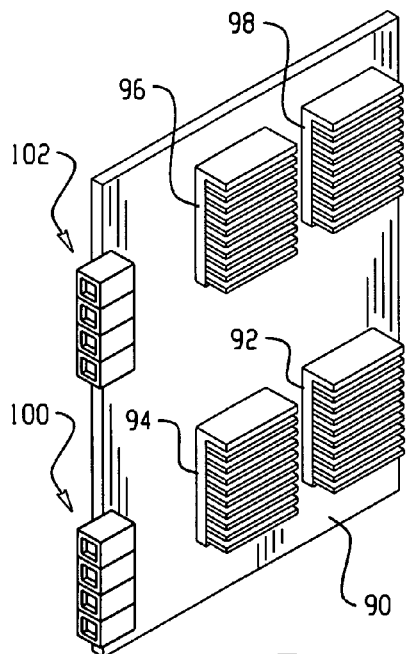
FIGS. 4A and 4B are respective front and back isometric perspective views of the top of an exemplary interconnect board for use in a flexible midplane assembly.
Figure 4B:
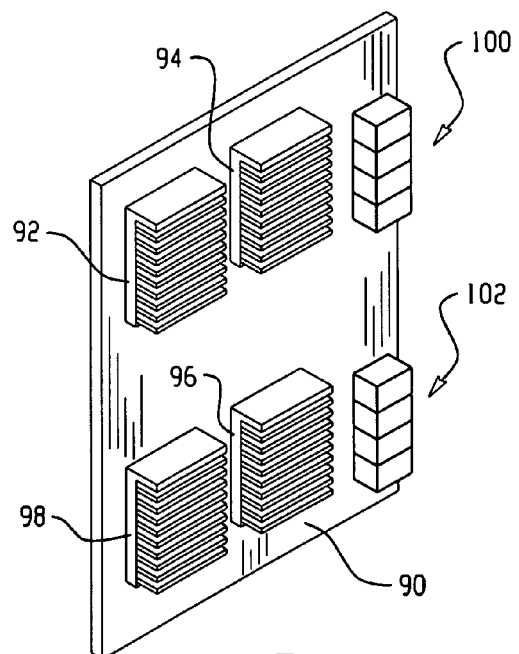

In small multi-processor or server applications, it is understood that the traditional backplane may be replaced with a single midplane which will satisfy the operational needs thereof. However, where the traditional backplane is to be replaced with more than one midplane in a multi-processor computer system, some arrangement is made to interconnect the replacement midplanes to replicate the overall connections of the backplane for arbitrating communication between the various cell boards thereof. In the present example, an interconnection board, such as a switch card, for example, may be used to interconnect the various midplanes of the system. An exemplary switch card for this purpose is illustrated in the isometric views of FIGS. 4A, 4B, 5A and 5B. FIGS. 4A and 4B are respective front and back isometric perspective views of the top of the exemplary switch card and FIGS. 5A and 5B are respective front and back isometric perspective views of the bottom of the exemplary switch card.

Referring to FIGS. 4A, 4B, 5A and 5B, the exemplary interconnect card comprises a printed circuit board 90 on which may be mounted a plurality of controller or "cross-bar" ICs 92, 94, 96 and 98, which may be application specific integrated circuits (ASICs), for example, with corresponding heat sinks. The controller ICs 92, 94, 96 and 98 are used in the present embodiment to manage switching and routing of signals and data between the midplanes 10 of the computer system. At the front edge of the board 90 are disposed two sets of connectors 100 and 102 for mating to like connectors of two midplanes 10 for managing the communication therebetween. For example, connector 100 may mate with connector 42 of one midplane and connector 102 may mate with connector 52 of another midplane as will become more evident from the following description. Printed circuit runs of board 90 will interconnect the connector pins of connectors 100 and 102 with the controller ICs 92, 94, 96 and 98 thereof. Other connectors (not shown) may be included on the board 90 to interconnect the board to other computer systems and/or IO devices outside of the present system. Note that the arrangement of the components on board 90 is conducive with front-to-back and back-to-front cooling air flow.

It is understood that for those applications in which only a single midplane is used, the interconnect board may be only half of what is illustrated in FIGS. 4A and 4B and perform principally the function of managing switching and routing of signals and data between the cell boards of the single midplane, for example. This embodiment of the present invention will become more evident from the description found herein below.

Figure 6:
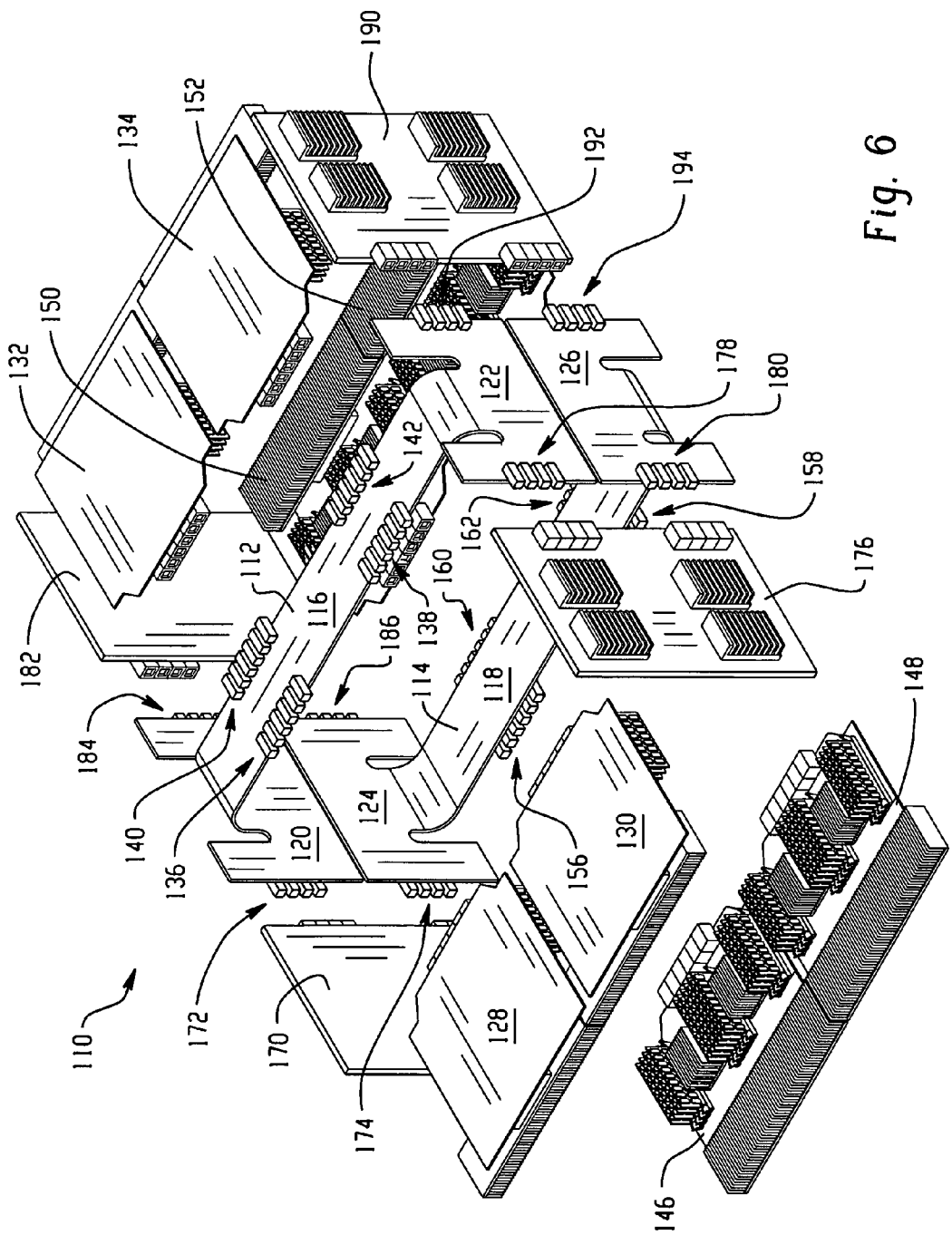
FIG. 6 is a break-away isometric perspective illustration of an exemplary dual flexible midplane assembly for a multi-processor system.

FIG. 6 is a break-away isometric perspective illustration of a two midplane multi-processor system 110 which comprises top and bottom flexible midplanes 112 and 114, respectively, which may be of the type described in connection with FIGS. 1A and 1B herein above, for example. The side sections of each midplane 112 and 114 are bent substantially orthogonal to the middle section thereof. The side sections 120 and 122 of the top midplane 112 are oriented downward in relation to the middle section 116 thereof, and the side sections 124 and 126 of the bottom midplane 114 are oriented upward in relation to the middle section 118 thereof. Accordingly, the top edges of side sections 124 and 126 of midplane 114 are aligned respectively with the bottom edges of side sections 120 and 122 of midplane 112.

In this embodiment, four cell boards 128, 130, 132 and 134 may be mated respectively to connectors 136, 138, 140 and 142 of the middle section 116 of midplane 112 to form a top plane in line with the middle section 116. The cell boards 128, 130, 132 and 134 of the top plane are inverted in orientation, i.e. bottom side up. Like wise, another four cell boards 146, 148, 150 and 152 may be mated respectively to connectors 156, 158, 160 and 162 of the middle section 118 of midplane 114 to form a bottom plane in line with the middle section 118. The cell boards 146, 148, 150 and 152 of the bottom plane are upright in orientation, i.e. top side up.

All eight of the cell boards of the present embodiment are oriented such that the cooling air may flow between the upper and lower planes formed thereby and across the cell board components thereof. Such cooling air will flow from back-to-front across boards 128, 130, 146 and 148 and from front-to-back across cell boards 132, 134, 150 and 152, or vice versa. As noted above, the cell board components are arranged on the boards to maximize the effectiveness of the cooling air as it flows across each board from front-to-back and from back-to-front.

In addition, interconnect boards, which may be similar to the switch cards described here above in connection with FIGS. 4A and 4B, for example, are used to provide communication between the cell boards of the midplanes 112 and 114. In the present embodiment, an interconnect board 170 is mated to connectors 172 and 174 of the front of side sections 120 and 124, respectively; an interconnect board 176 is mated to connectors 178 and 180 of the front of side sections 122 and 126, respectively; an interconnect board 182 is mated to connectors 184 and 186 of the back of side sections 120 and 124, respectively; and an interconnect board 190 is mated to connectors 192 and 194 of the back of side sections 122 and 126, respectively.

It is worthy to note that the midplanes may be passive PC boards, i.e. with routing only and without active components; and thus, are not vulnerable to active component failures. Therefore, it is the interconnect boards, like 170 and 176, for example, that provide the management of switching and routing of signals between the various cell boards and IO devices. The midplanes accommodate the interconnections therebetween. However, if there is a change in system architecture, the midplanes can remain as connected and a different interconnect board may replace a current interconnect board to accommodate the change in system architecture. This merely involves disconnecting the current interconnect board from its connector(s) and replacing it with the replacement interconnect board.

Figure 6A:
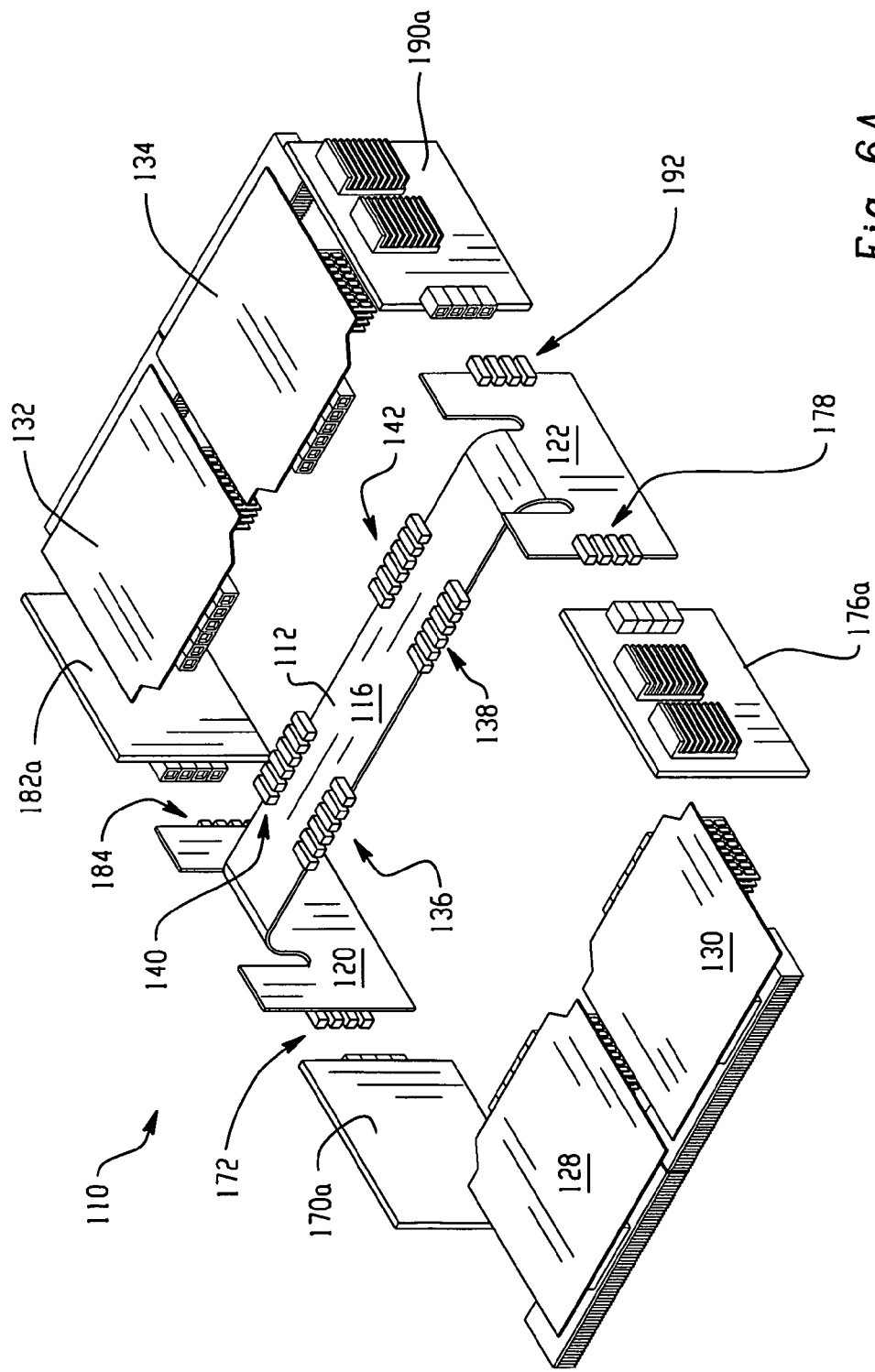
FIG. 6A is a break-away isometric perspective illustration of an exemplary single flexible midplane assembly for a multiprocessor system.

While FIG. 6 illustrates a dual midplane assembly embodiment, a single midplane assembly may be desired in some small multi-processor or server applications as noted above. Such an embodiment is illustrated in FIG. 6A which is essentially half of the embodiment described hereabove in connection with FIG. 6. In the illustration of FIG. 6A, common assembly elements with FIG. 6 will retain the same reference numerals without further description thereof. Interconnecting switch boards 170a, 176a, 182a and 190a may be half the size of the corresponding PC boards 170, 176, 182 and 190 illustrated and described in connection with the embodiment of FIG. 6 and perform principally the function of managing switching and routing of signals and data between the cell boards 128, 130, 132 and 143 of the single midplane 112, for example. Such interconnecting boards 170a, 176a, 182a and 190a may also include IO connectors for interfacing with external systems and devices.

In addition, while the top midplane assembly of the embodiment of FIG. 6 was used to describe the single midplane assembly, it is understood that the top midplane assembly embodiment was merely presented by way of example and that the bottom midplane assembly may also serve as a single midplane embodiment just as well without deviating from the broad principles of the present invention.

Figure 7:
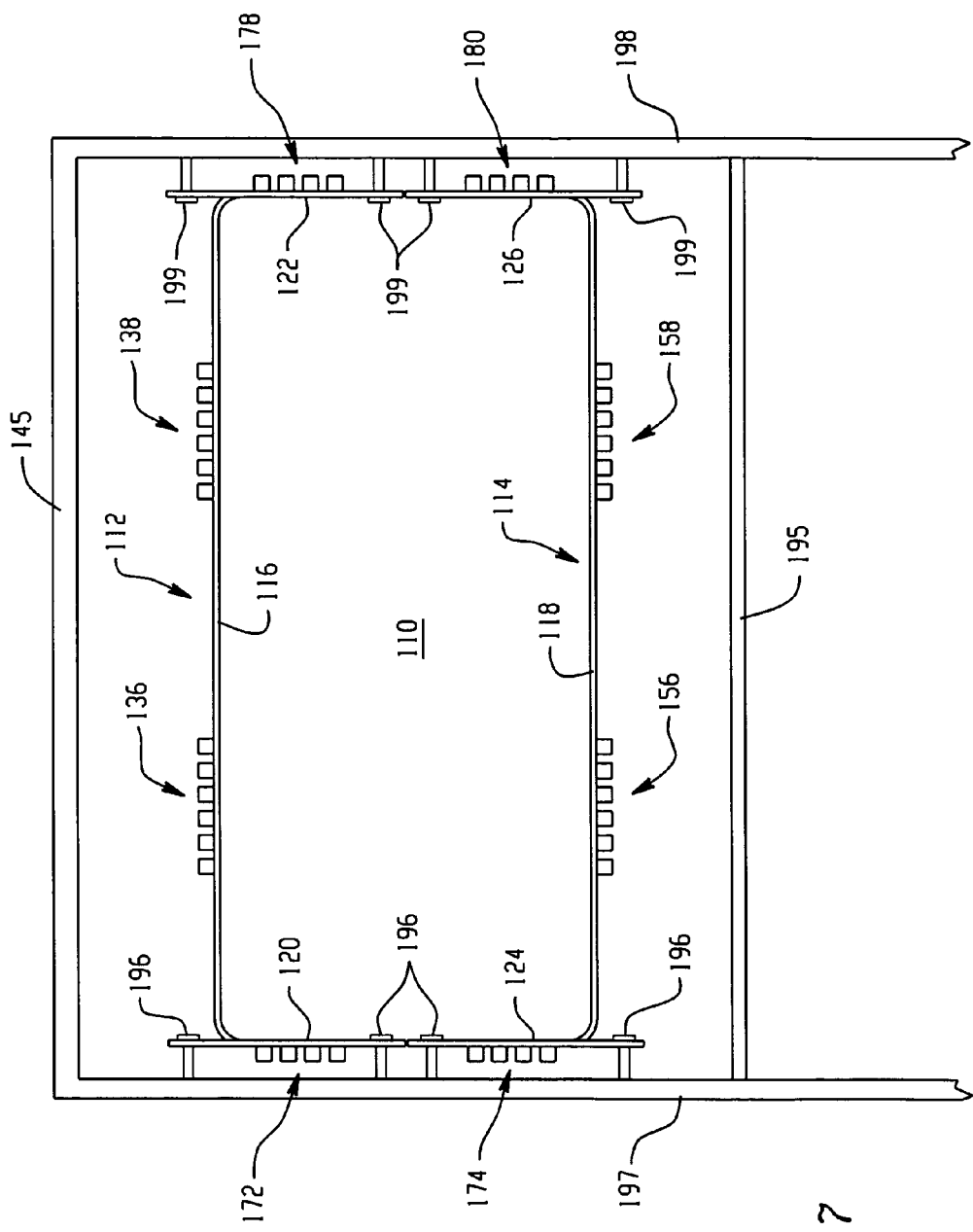
FIG. 7 is a cross-sectional illustration of a cabinet rack containing a dual flexible midplane assembly.

The dual midplane assembly described above may be disposed approximately midway within a cabinet rack 195 as shown by the front, cross-sectional view of FIG. 7. Referring to FIG. 7, the side sections 120, 122, 124 and 126 of the midplanes 112 and 114 are flexed in planes that are substantially orthogonal to the planes of their respective midsections 116 and 118 so that they will align with the sides 197 and 198 of the cabinet rack 195. More specifically, the side sections 120 and 124 may be secured to one side 197 of the cabinet rack 195 by bolt and spacer assemblies 196, for example. Likewise, the side sections 122 and 126 may be secured to the other side 198 of the cabinet rack 195 by similar bolt and spacer assemblies 199. In this manner, the side sections 120 and 124 are aligned with and supported by the cabinet side 197 and side sections 122 and 126 are aligned with and supported by the cabinet side 198. Accordingly, the entire dual midplane assembly 110 may be positioned midway within and supported by the cabinet rack 195. While the dual midplane assembly 110 is illustrated in FIG. 7, it is understood that the configuration may be applied to the single midplane embodiment equally as well.

As such, cell boards 128, 130, 146 and 148 may be inserted into and extracted from (via connectors 136, 138, 156, 158) the midsections 116 and 118 of their respective midplanes 112 and 114 from the front of the cabinet rack. The cabinet rack 195 may be sized so that all of the cell boards 128, 130, 146 and 148 may fit within the front section of the rack 195 when inserted into their respective midplanes 112 and 114. Likewise, cell boards 132, 134, 150 and 152 may be inserted into and extracted from (via connectors 140, 142, 160, 162) the midsections 116 and 118 of their respective midplanes 112 and 114 from the back of the cabinet rack. While this perspective is not shown in front, cross-sectional view of FIG. 7, it is evident from the overall assembly view of FIG. 6. The cabinet rack 195 may be also sized so that all of the cell boards 132, 134, 150 and 152 may fit within the rear section of the rack 195 when inserted into their respective midplanes 112 and 114.

Also, the side sections 120 and 124 are mounted spaced away from their respective cabinet side 197 to provide an adequate vertical space therebetween to insert and extract the interconnect board 170 via connectors 172 and 174 from the front of the cabinet rack 195. In a similar manner, the side sections 122 and 126 are mounted spaced away from their respective cabinet side 198 to provide an adequate vertical space therebetween to insert and extract the interconnect board 176 via connectors 178 and 180 from the front of the cabinet rack 195. Likewise, the same vertical spaces between sides 120, 124 and cabinet side 197 and between sides 122, 126 and cabinet side 198 enable the insertion and extraction of the interconnect boards 182 and 190 with their respective midplanes 112 and 114 from the back or rear of the cabinet rack 195 (see FIG. 6). The cabinet rack 195 may be also sized so that all of the interconnect boards 170, 176, 182 and 190 may fit within the front and rear sections of the rack 195 when inserted into their respective midplanes 112 and 114. Therefore, in the present example, all of the cell and interconnect boards are accessible from the front and rear of the cabinet rack 195.

Figure 8:
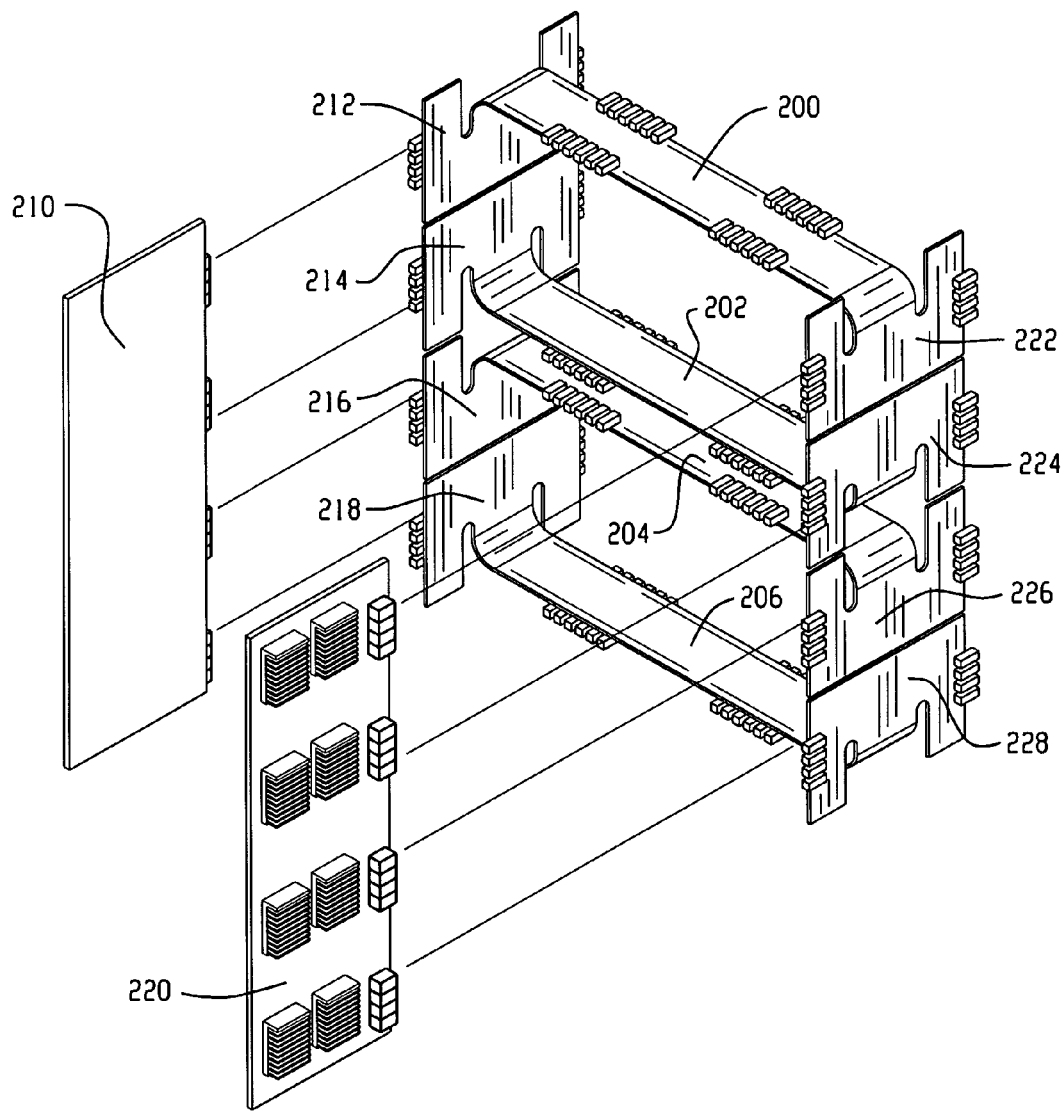
FIG. 8 is a break-away isometric perspective illustration of an exemplary four flexible midplane assembly.

FIG. 8 is a break-away isometric perspective illustration of an exemplary four midplane multi-processor system 110 which comprises two sets of top and bottom flexible midplanes 200, 202 and 204, 206, respectively. All of the midplanes 200-206 may be of the type described in connection with FIGS. 1A and 1B herein above, for example. In addition, each set of midplanes 200, 202 and 204, 206 may be similar to the two midplane assembly described here above in connection with FIG. 6 except that in the instant four midplane embodiment, only one interconnect board may be used to interconnect the four midplanes 200-206 on each side of the assembly. In the instant embodiment, midplane 200 includes side sections 212 and 222, midplane 202 includes side sections 214 and 224, midplane 204 includes side sections 216 and 226, and midplane 208 includes side sections 218 and 228.

Referring to the exemplary assembly of FIG. 8, an interconnect board 210 may be mated to the front connectors of the side sections 212, 214, 216 and 218 on one side of the respective midplanes 200, 202, 204 and 206 and an interconnect board 220 may be mated to the front connectors of the side sections 222, 224, 226 and 228 on the other side of the respective midplanes 200, 202, 204 and 206. Similar interconnect boards (not shown) may be mated to the back connectors of side sections 212, 214, 216 and 218 and to the back connectors of the side sections 222, 224, 226 and 228. It is understood that in some applications, less than four interconnect boards may be used for the inter-midplane communication. For example, only two interconnect boards as shown in FIG. 8 may be adequate to provide sufficient communication between the midplanes 200-206 for some applications.

While the exemplary embodiment of FIG. 8 uses interconnect boards 210 and 220 to interconnect all of the four midplanes, it is understood that various combinations of midplane interconnect boards may be used just as well. For example, one midplane interconnect board may be used to interconnect sides 212, 214, 216 and 218, but two interconnect boards may be used to interconnect sides 222, 224, 226 and 228. In this example, one interconnect board may be used to interconnect midplane sides 222 and 224, and the other may be used to interconnect midplane sides 226 and 228. In another example, one of the two boards 210 and 220 may be offset the other referred to as "zippering", or the two boards 210 and 220 may be different boards, performing different functions. These are just a few of the examples of the myriad of combinations and hybrids which fall within the scope of this aspect of the present invention.

Figure 9:
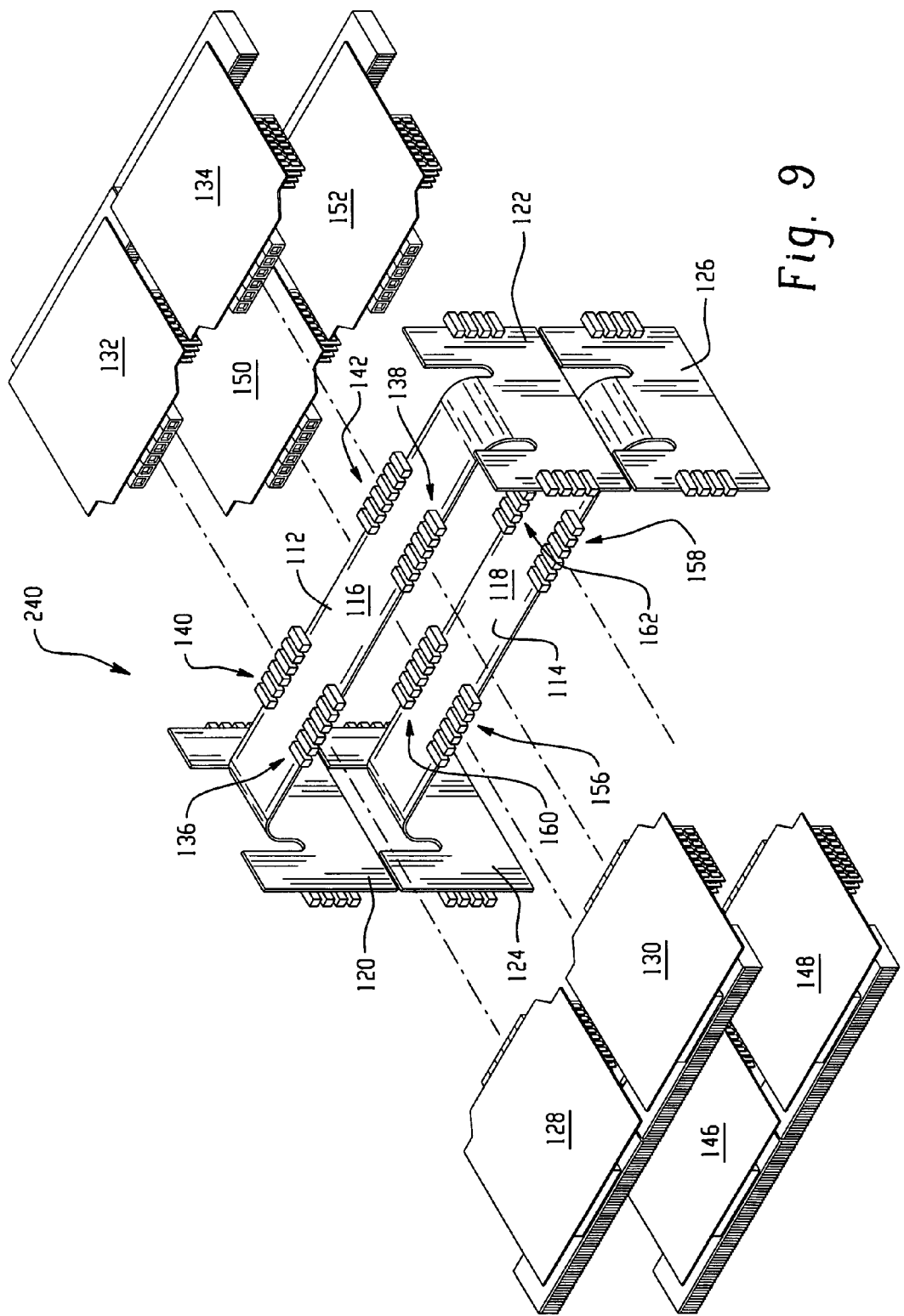
FIG. 9 is a break-away isometric perspective illustration of an alternate dual flexible midplane assembly for a multiprocessor system.

FIG. 9 is a break-away isometric perspective illustration of an alternate embodiment 240 of the two midplane multi-processor system 110 illustrated in FIG. 6. Referring to FIG. 9, the reference numerals of assembly components common to the two embodiments will remain the same as used for the embodiment of FIG. 6. As with the embodiment of FIG. 6, the top and bottom flexible midplanes 112 and 114, respectively, may be of the type described in connection with FIGS. 1A and 1B herein above, for example. In addition, the side sections of each midplane 112 and 114 are bent substantially orthogonal to the middle section thereof. However, in the alternate embodiment of FIG. 9, the side sections 120 and 122 of the top midplane 112 and the side sections 124 and 126 of the bottom midplane 114 are both oriented downward in relation to their respective middle sections 116 and 118. Accordingly, the top edges of the feet of side sections 124 and 126 of midplane 114 are aligned respectively with the bottom edges of side sections 120 and 122 of midplane 112.

In this alternate embodiment, the four cell boards 128, 130, 132 and 134 may be mated respectively to connectors 136, 138, 140 and 142 of the middle section 116 of midplane 112 in the same manner as in the embodiment of FIG. 6 to form the top plane in line with the middle section 116. Likewise, the other four cell boards 146, 148, 150 and 152 may be mated respectively to connectors 156, 158, 160 and 162 of the middle section 118 of midplane 114 to form a bottom plane in line with the middle section 118. However, the cell boards 146, 148, 150 and 152 of the bottom plane are inverted in orientation, i.e. top side down, to render all eight of the cell boards of the alternate configuration top side down when mated to their respective midplanes 112 and 114.

As in the embodiment of FIG. 6, all eight of the cell boards of the present embodiment are oriented such that the cooling air may flow between the upper and lower planes formed thereby and across the cell board components thereof. As noted above, the cell board components are arranged on the boards to maximize the effectiveness of the cooling air as it flows across each board from front-to-back and from back-to-front. In addition, the interconnect boards 170, 176, 182 and 190 (not shown in FIG. 9) may be mated to their respective midplane connectors in the same manner as described in connection with the embodiment of FIG. 6.

Figure 10:
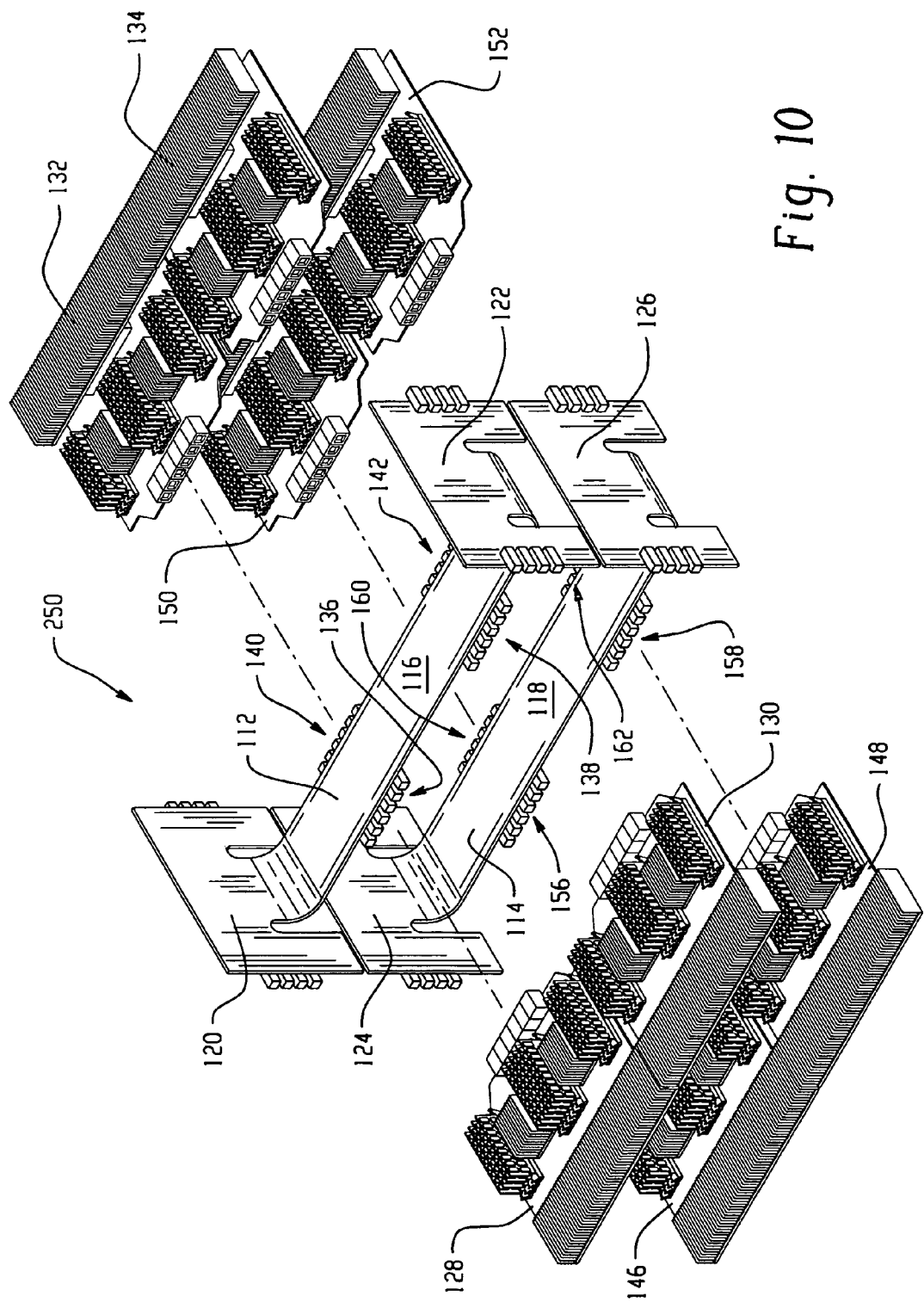
FIG. 10 is a break-away isometric perspective illustration of another alternate dual flexible midplane assembly for a multiprocessor system.

FIG. 10 is a break-away isometric perspective illustration of another alternate embodiment 250 of the two midplane multi-processor system 110 illustrated in FIG. 6. Referring to FIG. 10, the reference numerals of assembly components common to the two embodiments will remain the same as used for the embodiment of FIG. 6. As with the embodiment of FIG. 6, the top and bottom flexible midplanes 112 and 114, respectively, may be of the type described in connection with FIGS. 1A and 1B herein above, for example. In addition, the side sections of each midplane 112 and 114 are bent substantially orthogonal to the middle section thereof. However, in this other alternate embodiment of FIG. 10, the side sections 120 and 122 of the top midplane 112 and the side sections 124 and 126 of the bottom midplane 114 are both oriented upward in relation to their respective middle sections 116 and 118. Accordingly, the bottom edges of the feet of side sections 120 and 122 of midplane 112 are aligned respectively with the top edges of side sections 124 and 126 of midplane 112.

In this other alternate embodiment, the four cell boards 146, 148, 150 and 152 may be mated respectively to connectors 156, 158, 160 and 162 of the middle section 118 of midplane 114 in the same manner as in the embodiment of FIG. 6 to form the bottom plane in line with the middle section 118. However, the other four cell boards 128, 130, 132 and 134 are mated respectively to connectors 136, 138, 140 and 142 of the middle section 116 of midplane 112 inverted in orientation, i.e. top side up, to render all eight of the cell boards of this other alternate configuration top side up when mated to their respective midplanes 112 and 114. As in the embodiment of FIG. 6, all eight of the cell boards of the present embodiment are oriented such that the cooling air may flow between the upper and lower planes formed thereby and across the cell board components thereof. As noted above, the cell board components are arranged on the boards to maximize the effectiveness of the cooling air as it flows across each board from front-to-back and from back-to-front. In addition, the interconnect boards 170, 176, 182 and 190 (not shown in FIG. 10) may be mated to their respective midplane connectors in the same manner as described in connection with the embodiment of FIG. 6.

Figure 11:
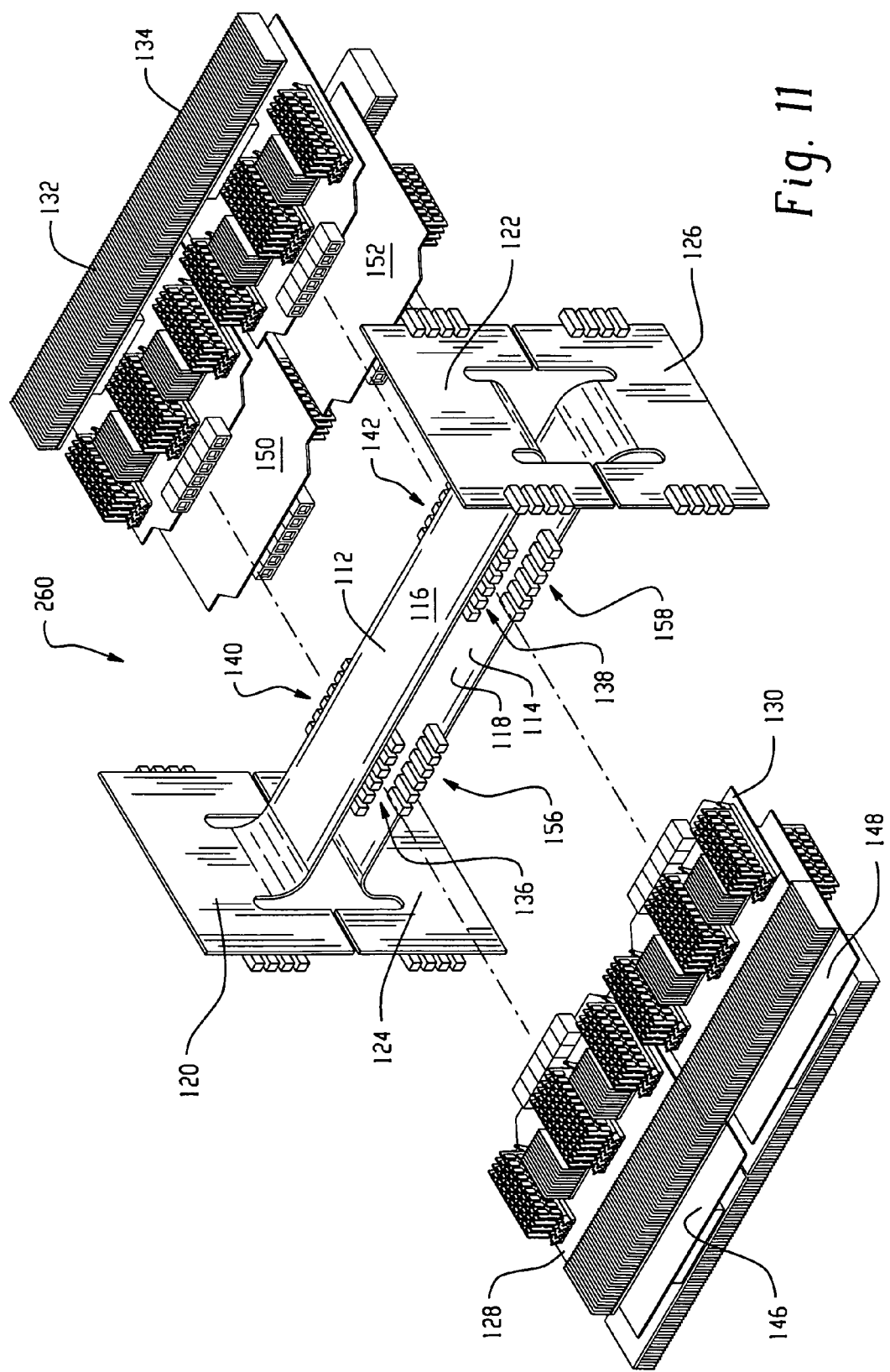
FIG. 11 is a break-away isometric perspective illustration of yet another dual flexible midplane assembly for a multi-processor system.

FIG. 11 is a break-away isometric perspective illustration of a third alternate embodiment 260 of the two midplane multi-processor system 110 illustrated in FIG. 6. Referring to FIG. 11, the reference numerals of assembly components common to the two embodiments will remain the same as used for the embodiment of FIG. 6. As with the embodiment of FIG. 6, the top and bottom flexible midplanes 112 and 114, respectively, may be of the type described in connection with FIGS. 1A and 1B herein above, for example. In addition, the side sections of each midplane 112 and 114 are bent substantially orthogonal to the middle section thereof. However, in this third alternate embodiment, the side sections 120 and 122 of the top midplane 112 are oriented upward in relation to their middle section 116, and the side sections 124 and 126 of the bottom midplane 114 are oriented downward in relation to their middle section 118. Accordingly, the edges of the feet of side sections 120 and 122 of midplane 112 are aligned respectively with the edges of the feet of the side sections 124 and 126 of midplane 112.

In this third alternate embodiment, the four cell boards 128, 130, 132 and 134 may be mated respectively to connectors 136, 138, 140 and 142 of the middle section 116 of midplane 112 in a top side up orientation to form the top plane in line with the middle section 116, and the other four cell boards 146, 148, 150 and 152 may be mated respectively to connectors 156, 158, 160 and 162 of the middle section 118 of midplane 114 in a bottom side up orientation. Thus, in this third alternate configuration, the bottom sides of the top plane cell boards 128, 130, 132 and 134 are juxtaposed with the bottom sides of the bottom plane cell boards 146, 148, 150 and 152. As in the embodiment of FIG. 6, all eight of the cell boards of the present embodiment are oriented such that the cooling air may flow between the upper and lower planes formed thereby and across the cell board components thereof. As noted above, the cell board components are arranged on the boards to maximize the effectiveness of the cooling air as it flows across each board from front-to-back and from back-to-front. In addition, the interconnect boards 170, 176, 182 and 190 (not shown in FIG. 11) may be mated to their respective midplane connectors in the same manner as described in connection with the embodiment of FIG. 6.

Figure 12:
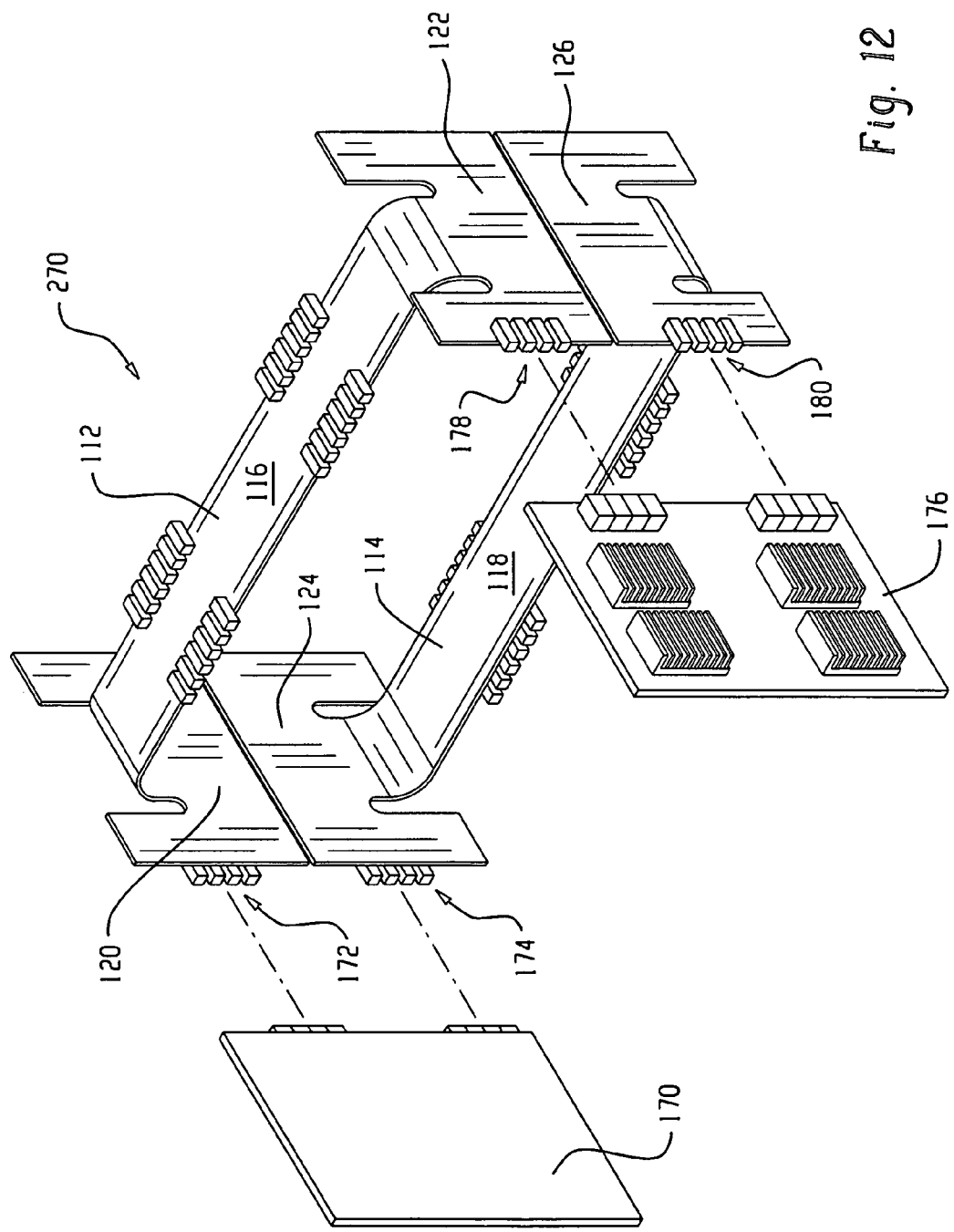
FIG. 12 is a break-away isometric perspective illustration of yet another dual flexible midplane assembly for a multi-processor system.
Figure 13:
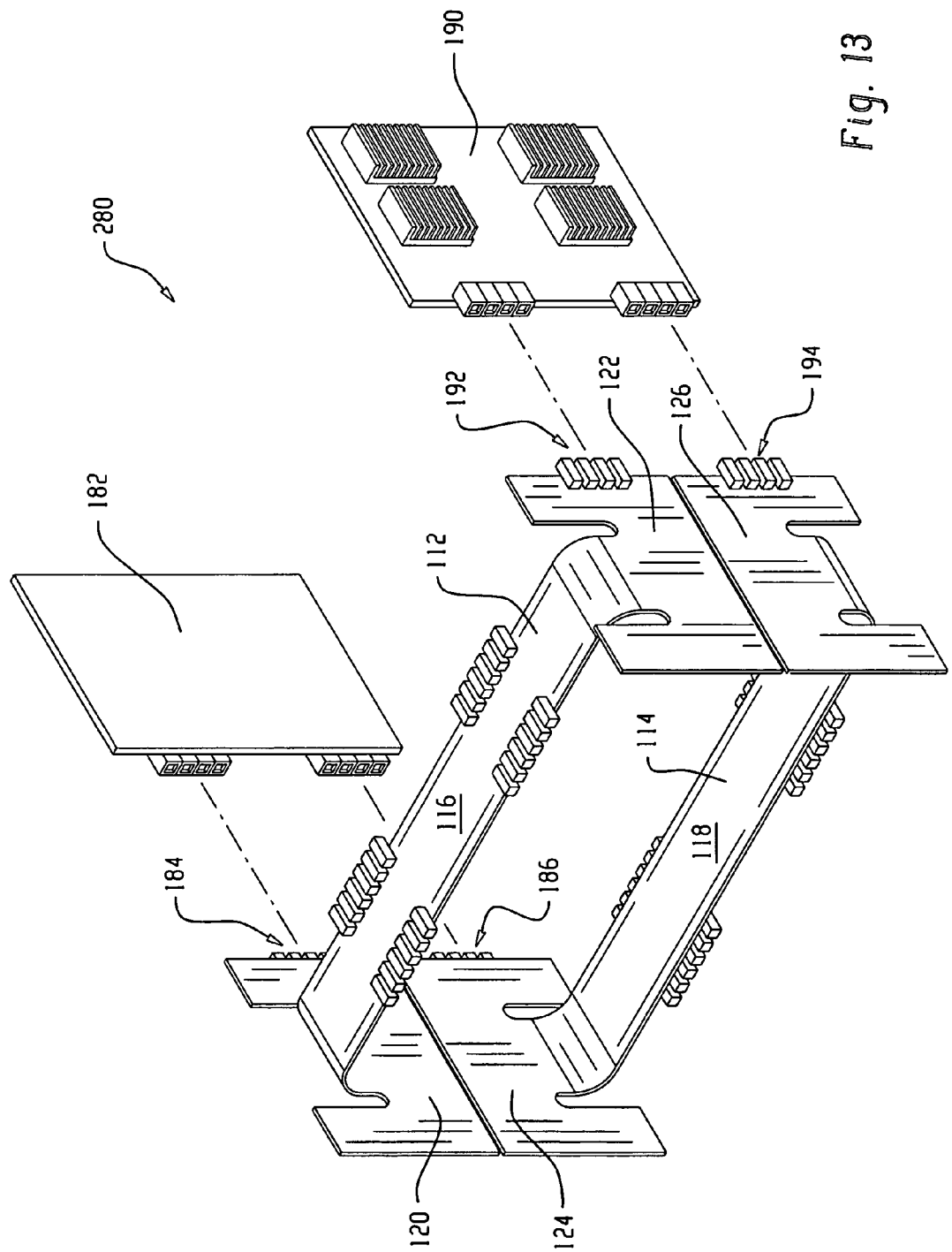
FIG. 13 is a break-away isometric perspective illustration of yet another dual flexible midplane assembly for a multi-processor system.

FIGS. 12 and 13 are break-away isometric perspective illustrations of fourth and fifth alternate embodiments 270 and 280, respectively, of the two midplane multi-processor system 110 illustrated in FIG. 6. In FIGS. 12 and 13, the reference numerals of the common components will remain the same for these fourth and fifth alternate embodiments. As with the embodiment of FIG. 6, the top and bottom flexible midplanes 112 and 114, respectively, may be of the type described in connection with FIGS. 1A and 1B herein above, for example, and be assembled in the same configuration.

In the embodiment 270 of FIG. 12, only the front "cross bar" connectors 172 and 178 of midplane 112 and front "cross bar" connectors 174 and 180 of midplane 114 are used to mate interconnect boards 170 and 176 to their respective side sections 120, 124 and 122, 126 of the midplanes 112 and 114. Accordingly, the back "cross bar" connectors of the midplanes may be eliminated in the embodiment 270. In the embodiment 280 of FIG. 13, only the back "cross bar" connectors 184 and 192 of midplane 112 and back "cross bar" connectors 186 and 194 of midplane 114 are used to mate interconnect boards 182 and 190 to their respective side sections 120, 124 and 122, 126 of the midplanes 112 and 114. Accordingly, the front "cross bar" connectors of the midplanes may be eliminated in the embodiment 280.

Figure 14:
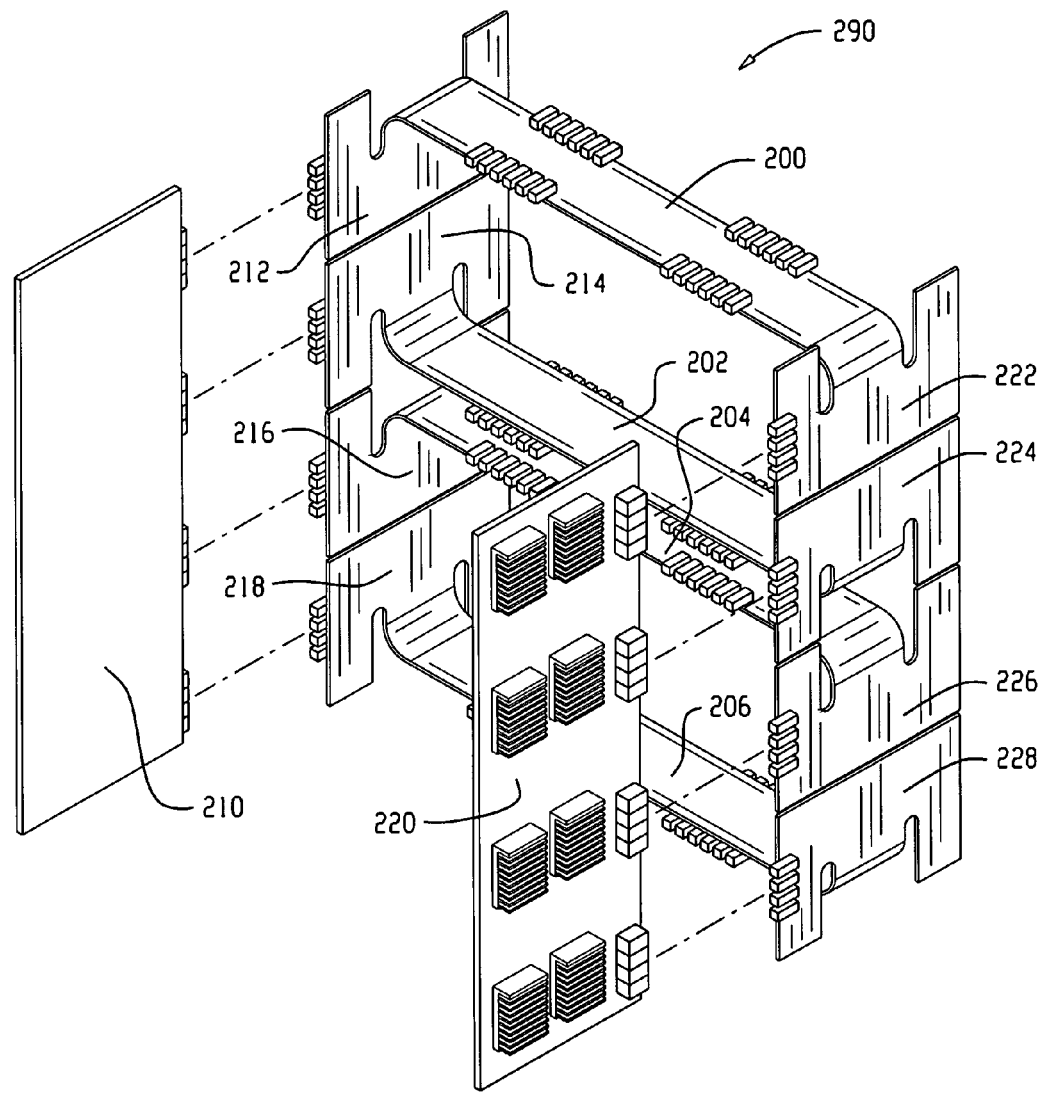
FIG. 14 is a break-away isometric perspective illustration of an alternate four flexible midplane assembly.

FIG. 14 is a break-away, isometric perspective view of an alternate embodiment to the four midplane assembly embodiment described supra in connection with FIG. 8. In FIG. 14, the reference numerals for common system components of the alternate embodiment will remain the same as used for the embodiment shown in FIG. 8. In the alternate embodiment of FIG. 14, the side sections of each of the four midplanes may include only front "cross bar" connectors for mating to interconnect boards. Also, in this alternate embodiment, only two interconnect boards 210 and 220 may be used to interconnect the four midplanes utilizing only the front "cross bar" connectors thereof. It is understood that while the alternate embodiment of FIG. 14 shows only front "cross bar" connectors for the side sections, only back "cross bar" connectors may also be used just as well. The use of front only or back only "cross bar" connectors will more than likely depend on the application.

Figure 15:
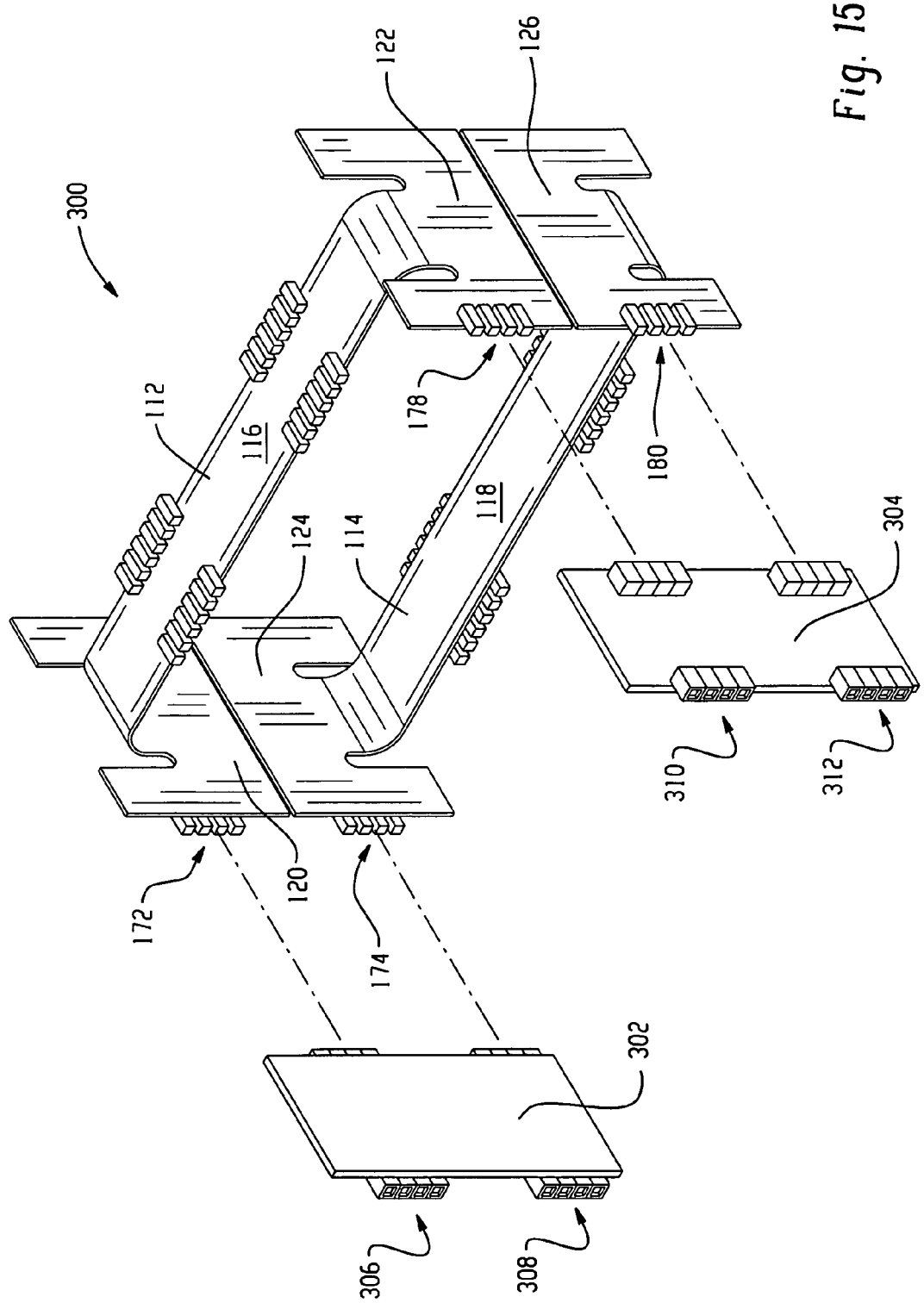
FIG. 15 is a break-away isometric perspective illustration of yet another dual flexible midplane assembly for a multi-processor system.

FIG. 15 is a break-away, isometric perspective illustration of yet another alternate embodiment 300 to the assembly embodiment of FIG. 6. In FIG. 15, the reference numerals of assembly components common to the two embodiments will remain the same as used for the embodiment of FIG. 6. In the alternate embodiment 300, instead of using active switch boards like 170 and 172, for example, for interconnecting the midplanes 112 and 114, passive interconnect boards are used in place thereof. For example, a passive interconnect board 302 may be mated to the front connectors 172 and 174 of the midplanes 112 and 114, and another passive interconnect board 304 may be mated to front connectors 178 and 180 of the midplanes 112 and 114.

Each of the passive interconnect boards 302 and 304 will not include any active components, like the "cross bar" ICs of switch boards 170 and 172, for example, but rather rely solely on etched printed circuit board runs for interconnections. However, the passive interconnect boards may include additional connectors, like connectors 306 and 308 for board 302 and connectors 310 and 312 for board 304, for example, for mating to corresponding switch or active interconnect boards depending on the application. The connectors 306, 308, 310 and 312 of the passive boards 302 and 304 may be also used to interconnect the system to other computer systems and/or to IO devices as well.

While the above presentation described various embodiments of single, two and four midplane assemblies (e.g. see FIGS. 6 and 8), it is understood that midplane assemblies of three and greater than four may be constructed by stacking additional single, two and/or four midplane assemblies together in much the same manner as described supra for the two and four midplane assemblies to render any plurality of midplane assembly desired. The design of the interconnect boards may be extended to interconnect the plurality midplane assembly and to connect the system to the outside world as needed. Thus, while the present invention has been described herein above in connection with the various embodiments, it is understood that such embodiments were presented merely by way of example. Accordingly, the present invention should not be limited to any single embodiment or combination of embodiments, by rather construed in breadth and broad scope in accordance with the recitation of the appended claims.

What is claimed is:

1. A flexible midplane comprising:
   a printed circuit board including:
      a generally planar middle section and at least one generally planar side section; and
      a flexible region disposed between said middle section and each side section, wherein the flexible region is more flexible than each of the middle section and the side section;
   wherein each flexible region permits the corresponding side section to be bent in relation to the middle section,
   wherein the side sections are patterned to form feet regions of the midplane on both sides of the respective flexible region when the side sections are bent substantially orthogonal to the middle section; and
   at least one connector disposed along an edge of the middle section to mate and electrically couple the middle section to another printed circuit board.

2. The flexible midplane of claim 1 wherein the degree of flexibility of each flexible region can be varied in the manufacture thereof.

3. The flexible midplane of claim 1 wherein each flexible region permits the corresponding side section to be bent substantially orthogonal to the middle section.

4. The flexible midplane of claim 1 wherein each flexible region permits the corresponding side section to retain its orientation to the middle section once bent into position.

5. The flexible midplane of claim 1 wherein each flexible region permits the corresponding side section to spring back to its original position.

6. The flexible midplane of claim 1 wherein said edge comprises a front or back edge of the middle section.

7. The flexible midplane of claim 1 further comprising an additional connector disposed along an edge of each side section.

8. The flexible midplane of claim 1 further comprising at least one additional connector disposed along at least one edge of each side section.

9. A single flexible midplane assembly comprising:
   a flexible midplane comprising:
      a printed circuit board including: a generally planar middle section and at least one generally planar side section;
      a flexible region disposed between said middle section and each side section to permit each side section to be bent substantially orthogonal to the middle section, wherein the flexible region is more flexible than each of the middle section and the side section;
   at least one connector disposed along a front edge or a back edge of the middle section to electrically couple the middle section to at least one other printed circuit board; and
   at least one connector disposed along at least one edge of each side section,
   wherein the side sections are patterned to form feet regions of the midplane on both sides of the respective flexible region when the side sections are bent substantially orthogonal to the middle section.

10. The single midplane assembly of claim 9 including a first plurality of circuit boards mated to the connectors disposed along the front and back edges of the middle section of the midplane to form a plane of first circuit boards.

11. The single midplane assembly of claim 9 including an interconnecting circuit board mated to the at least one connector disposed along at least one edge of each side section.

12. The single midplane assembly of claim 11 wherein the interconnecting circuit board is an active circuit board comprising at least one integrated circuit.

13. The single midplane assembly of claim 11 wherein the interconnecting circuit board is a passive circuit board.

14. The single midplane assembly of claim 9 including a cabinet rack; and wherein the single midplane is disposed within the cabinet rack and the side section of each side plane is secured to a corresponding side of the cabinet rack.

15. A method comprising:
   providing a printed circuit board including a generally planar middle section and at least one generally planar side section; and
   disposing a flexible region between the middle section and each of said at least one side section;
   bending each of said at least one side section relative to the middle section so that the side section is bent in relation to the middle section;
   disposing a connector on an edge of the middle section to electrically couple the middle section to another printed circuit board; and
   patterning the side sections to form feet regions of the midplane on both sides of the respective flexible region when the side sections are bent substantially orthogonal to the middle section.

16. The method of claim 15, wherein the act of bending comprises bending each side section of said at least one side section such that the side section is substantially orthogonal to the middle section.

17. The method of claim 15, further comprising:
   retaining an orientation of each side section of said at least one side section relative to the middle section due to a property of the flexible region.

18. The method of claim 15, wherein each flexible region permits the corresponding side section to spring back to its original position.

19. The method of claim 15, further comprising:
   mating the midplane to a plurality of first printed circuit boards, comprising mating connectors of the plurality of printed circuit boards to at least one connector disposed along both front and back edges of the middle section.

20. The method of claim 15, further comprising:
   disposing at least one connector along one edge of each side section of said at least one side section.

* * * * *